United States Patent
Lee et al.

(10) Patent No.: US 11,735,489 B2
(45) Date of Patent: Aug. 22, 2023

(54) SEMICONDUCTOR DEVICE AND METHOD OF FORMING HYBRID TIM LAYERS

(71) Applicant: STATS ChipPAC Pte. Ltd., Singapore (SG)

(72) Inventors: TaeKeun Lee, Incheon (KR); Youngcheol Kim, Gyeongki-do (KR); Youngmin Kim, Incheon (KR); Yongmin Kim, Incheon (KR)

(73) Assignee: STATS ChipPAC Pte. Ltd., Singapore (SG)

(*) Notice: Subject to any disclaimer, the term of this patent is extended or adjusted under 35 U.S.C. 154(b) by 219 days.

(21) Appl. No.: 17/349,135

(22) Filed: Jun. 16, 2021

(65) Prior Publication Data

US 2022/0406675 A1 Dec. 22, 2022

(51) Int. Cl.
*H01L 23/48* (2006.01)
*H01L 23/367* (2006.01)
*H01L 23/498* (2006.01)
*H01L 21/48* (2006.01)
*H01L 23/00* (2006.01)
*H01L 23/373* (2006.01)
*H01L 21/78* (2006.01)

(52) U.S. Cl.
CPC ........ *H01L 23/367* (2013.01); *H01L 21/4857* (2013.01); *H01L 21/4882* (2013.01); *H01L 23/3735* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 21/78* (2013.01); *H01L 2224/16235* (2013.01); *H01L 2924/35121* (2013.01)

(58) Field of Classification Search
CPC .............. H01L 23/367; H01L 21/4882; H01L 23/3735; H01L 23/49822; H01L 24/16
See application file for complete search history.

(56) References Cited

U.S. PATENT DOCUMENTS

| | | | |
|---|---|---|---|
| 8,481,103 B1* | 7/2013 | Davidson | H01L 24/29 427/369 |
| 9,839,159 B1 | 12/2017 | Banijamali | |
| 2008/0230893 A1* | 9/2008 | Too | H01L 23/04 257/704 |
| 2014/0061893 A1* | 3/2014 | Saeidi | H01L 23/562 438/122 |
| 2018/0027691 A1* | 1/2018 | Czaplewski | B29C 43/18 428/213 |

* cited by examiner

*Primary Examiner* — Nicholas J Tobergte
(74) *Attorney, Agent, or Firm* — Robert D. Atkins; Patent Law Group: Atkins and Associates, P.C.

(57) ABSTRACT

A semiconductor device has an electrical component and a first TIM with a first compliant property is disposed over a surface of the electrical component. A second TIM having a second compliant property greater than the first compliant property is disposed over the surface of the electrical component within the first TIM. A third TIM can be disposed over the surface of the electrical component along the first TIM. A heat sink is disposed over the first TIM and second TIM. The second TIM has a shape of a star pattern, grid of dots, parallel lines, serpentine, or concentric geometric shapes. The first TIM provides adhesion for joint reliability and the second TIM provides stress relief. Alternatively, a heat spreader is disposed over the first TIM and second TIM and a heat sink is disposed over a third TIM and fourth TIM on the heat spreader.

25 Claims, 11 Drawing Sheets

SEMICONDUCTOR DEVICE AND METHOD OF FORMING HYBRID TIM LAYERS

FIELD OF THE INVENTION

The present invention relates in general to semiconductor devices and, more particularly, to a semiconductor device and method of forming hybrid thermal interface material (TIM) layers for a heat sink.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are susceptible to heat from operation of the semiconductor die. Some semiconductor die, such as microprocessor, operate at a high clock frequency and generate heat from rapid transistor switching. Other semiconductor devices, such as a power MOSFET, generate heat by conducting significant current. In many applications, a full TIM layer is deposited to completely cover the semiconductor die, and a heat sink is disposed over the TIM layer to dissipate heat. The heat generated by an operational semiconductor die is often dissipated through the center of die. The TIM layer must transfer the heat from the center of the semiconductor die to the heat sink. In some cases, the TIM layer is made soft, compliant and low adhesion to minimize mechanical stress on the semiconductor die from coefficients of thermal expansion (CTE) of the different materials. Yet, the soft, compliant, low adhesion TIM layer is susceptible to delamination of the heat sink. The TIM layer provides low joint reliability and leads to device failures.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
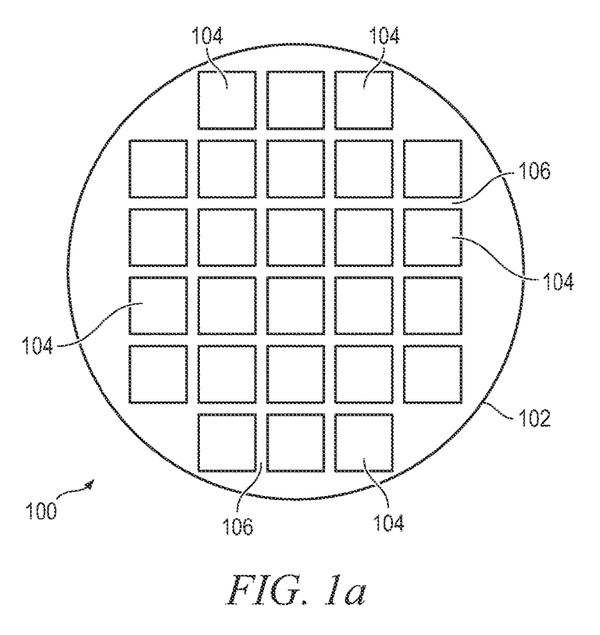
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
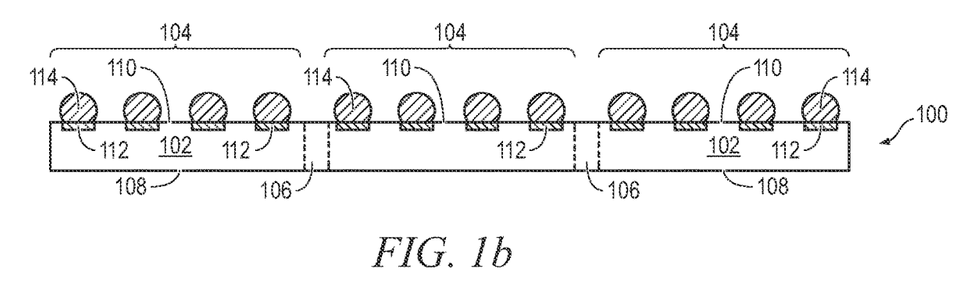

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
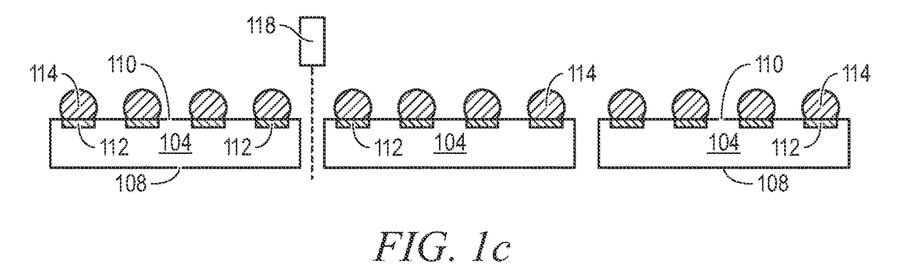

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
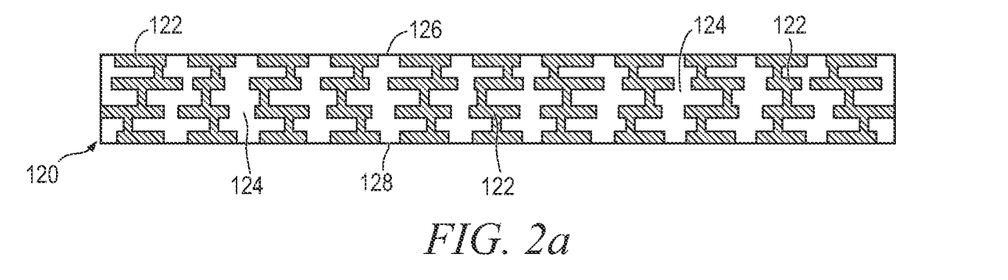
FIGS. 2a-2e illustrate a process of forming a semiconductor package with semiconductor die and interconnect substrate.

FIGS. 2a-2e illustrate a process of forming a semiconductor package with semiconductor die and interconnect substrate. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
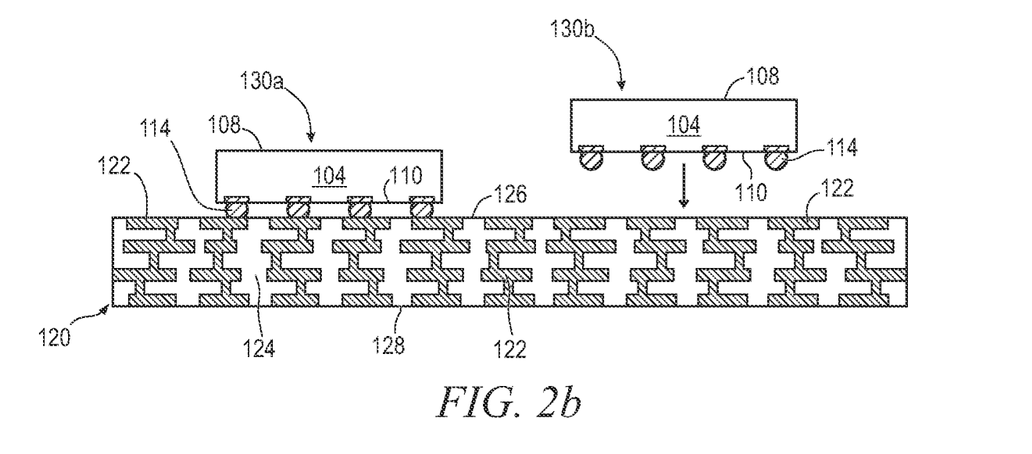
Figure 2C:
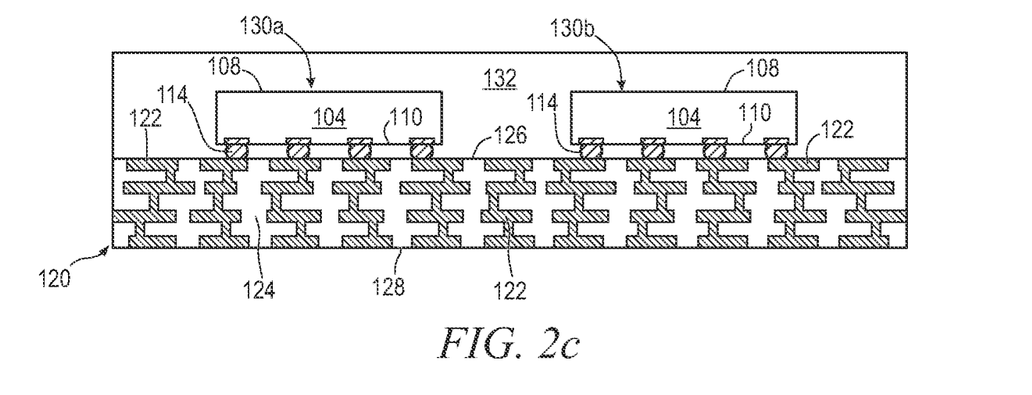

In FIG. 2b, a plurality of electrical components 130a-130b is mounted to surface 126 of interconnect substrate 120 and electrically and mechanically connected to conductive layers 122. Electrical components 130a-130b are each positioned over substrate 120 using a pick and place operation. For example, electrical components 130a and 130b can be semiconductor die 104 from FIG. 1c with active surface 110 and bumps 114 oriented toward surface 126 of substrate 120 and electrically connected to conductive layer 122. Alternatively, electrical components 130a-130b can include other semiconductor die, semiconductor package, surface mount device, discrete electrical device, discrete transistor, diode, or IPD. Electrical components 130a-130b are mounted to interconnect substrate 120, as shown in FIG. 2c, with bumps 114 making mechanical and electrical connection to conductive layer 122.

An encapsulant or molding compound 132 is deposited over electrical components 130a-130b and surface 126 of interconnect substrate 120 using a paste printing, compressive molding, transfer molding, liquid encapsulant molding, vacuum lamination, spin coating, or other suitable applicator. Encapsulant 132 can be polymer composite material, such as epoxy resin with filler, epoxy acrylate with filler, or polymer with proper filler. Encapsulant 132 is non-conductive, provides structural support, and environmentally protects the semiconductor device from external elements and contaminants.

Figure 2D:
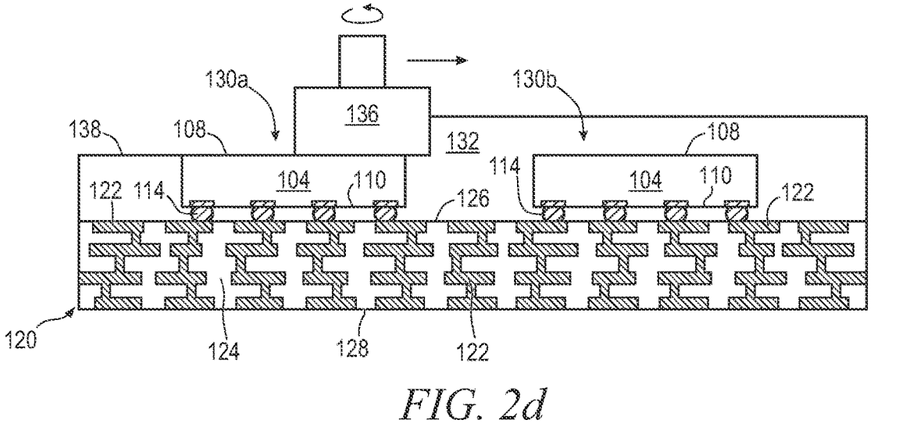

In FIG. 2d, a portion of encapsulant 132 is removed by grinder 136 to expose surface 138 of encapsulant 132 coplanar with back surface 108 of semiconductor die 104. Grinder 136 planarizes surface 138 of encapsulant 132 and back surface 108 of semiconductor die 104.

Figure 2E:
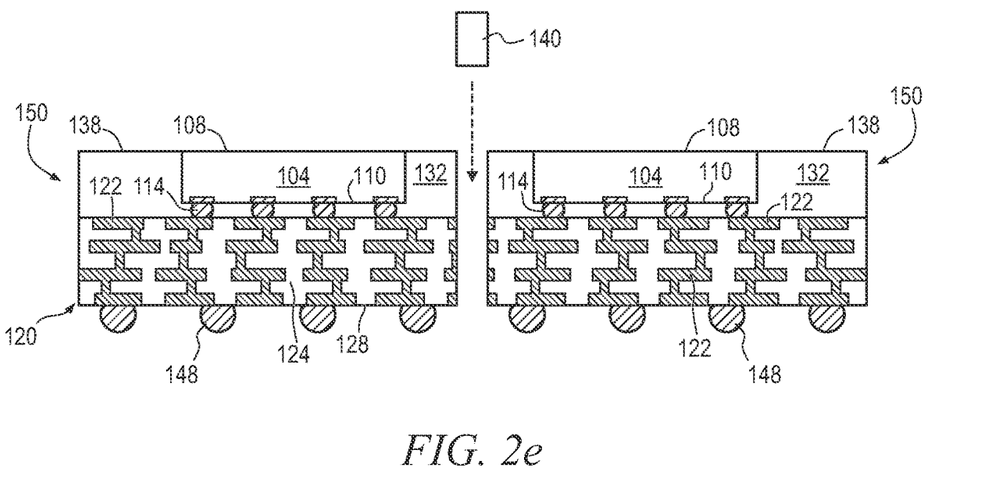

In FIG. 2e, interconnect substrate 120 is singulated between electrical components 130a-130b using a saw blade or laser cutting tool 140 into individual semiconductor packages 150.

An electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 148. In one embodiment, bump 148 is formed over a UBM having a wetting layer, barrier layer, and adhesive layer. Bump 148 can also be compression bonded or thermocompression bonded to conductive layer 122. Bump 148 represents one type of interconnect structure that can be formed over conductive layer 122. The interconnect structure can also use bond wires, conductive paste, stud bump, micro bump, or other electrical interconnect.

Figure 3A:
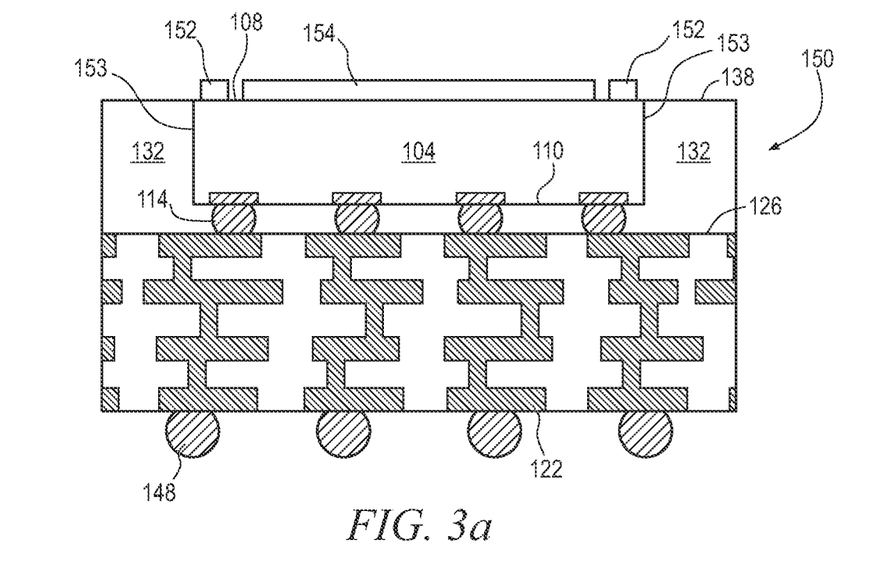
FIGS. 3a-3k illustrate a process of forming a hybrid TIM layer and heat sink over the semiconductor package.
Figure 3B:
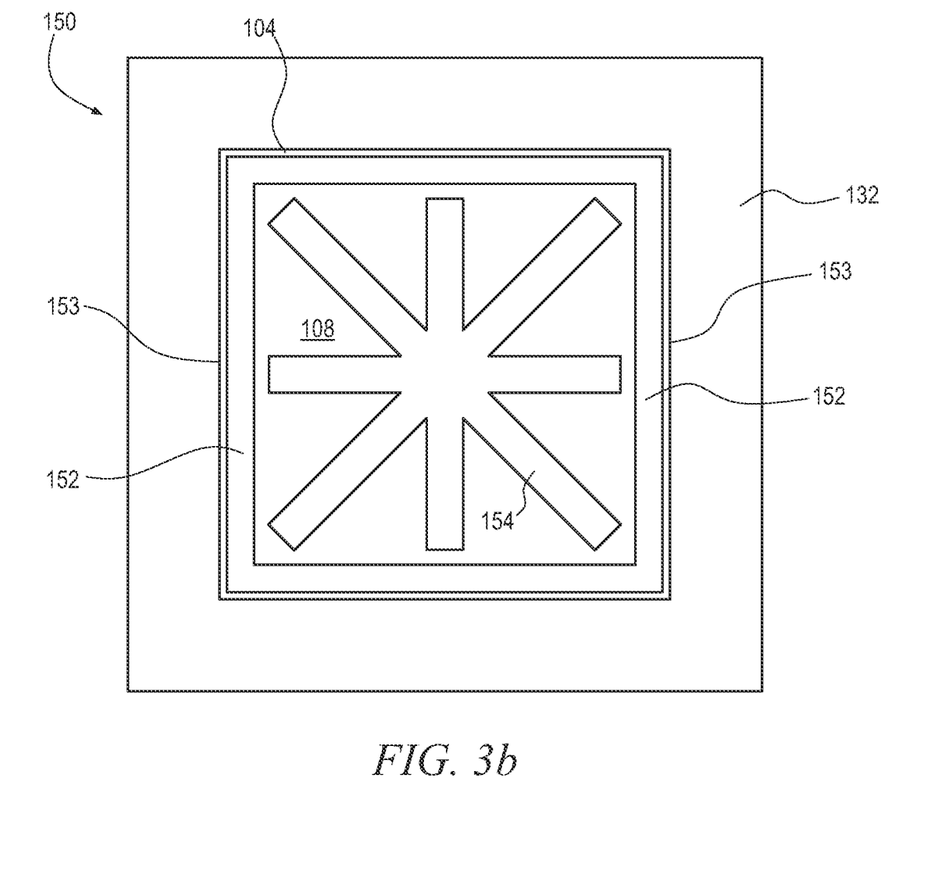
Figure 3C:
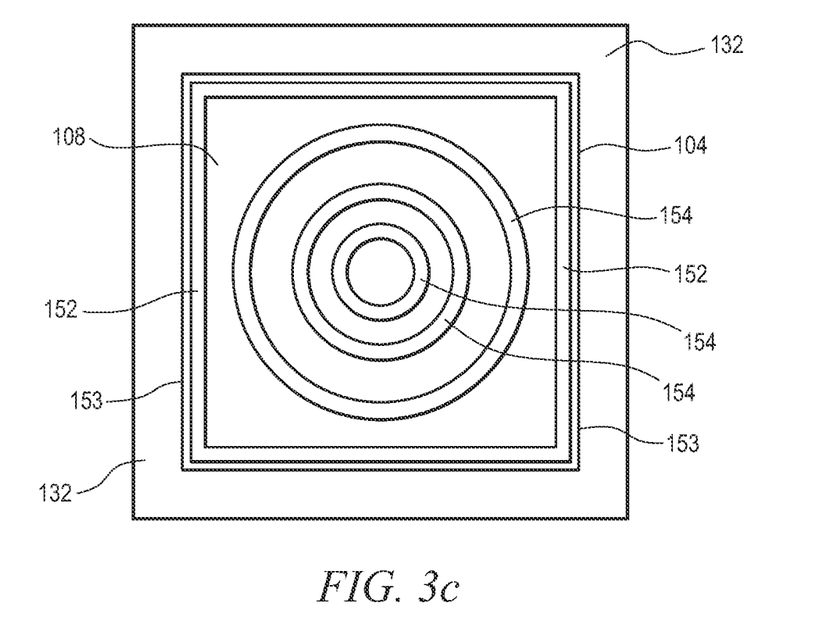
Figure 3D:
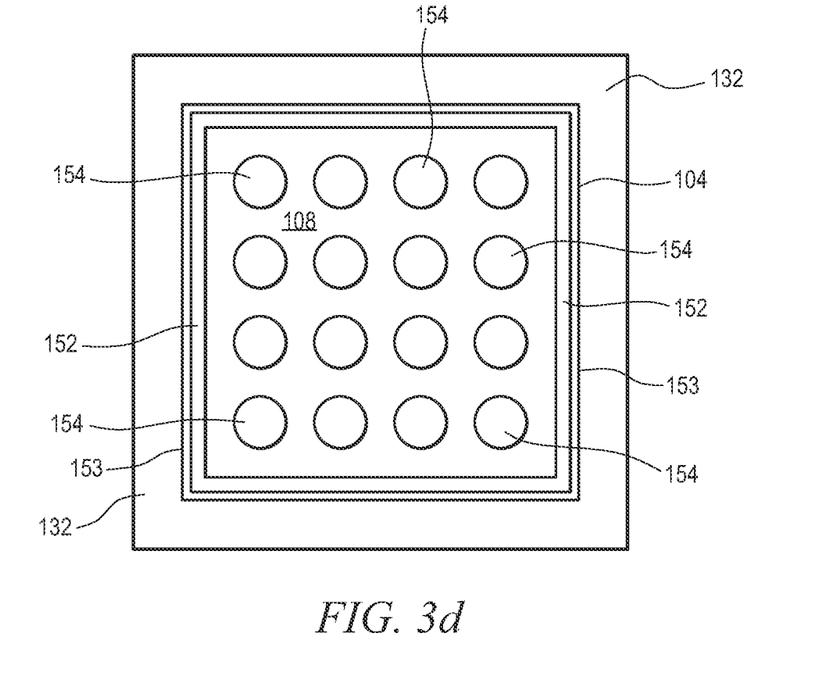
Figure 3E:
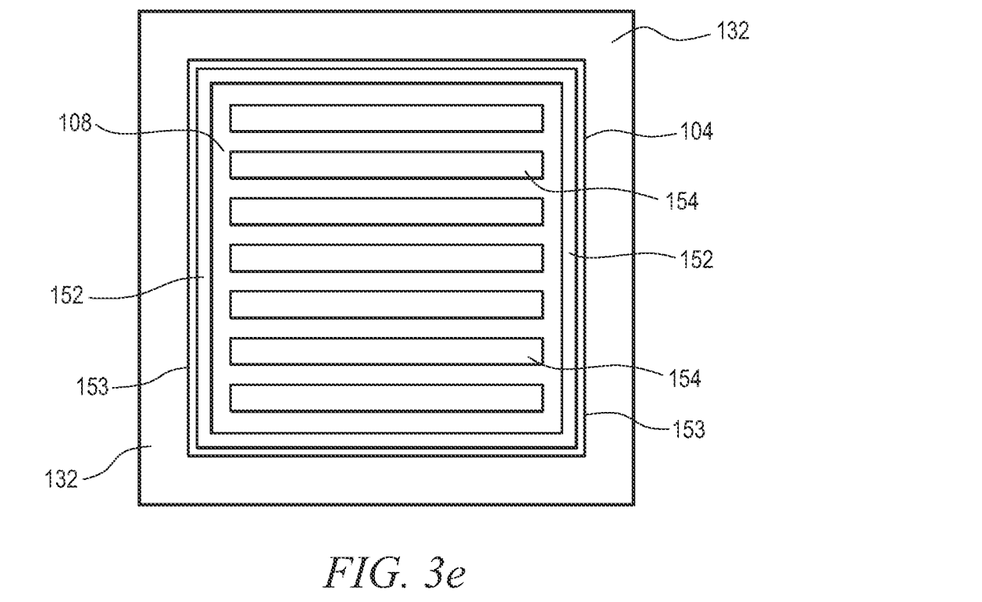
Figure 3F:
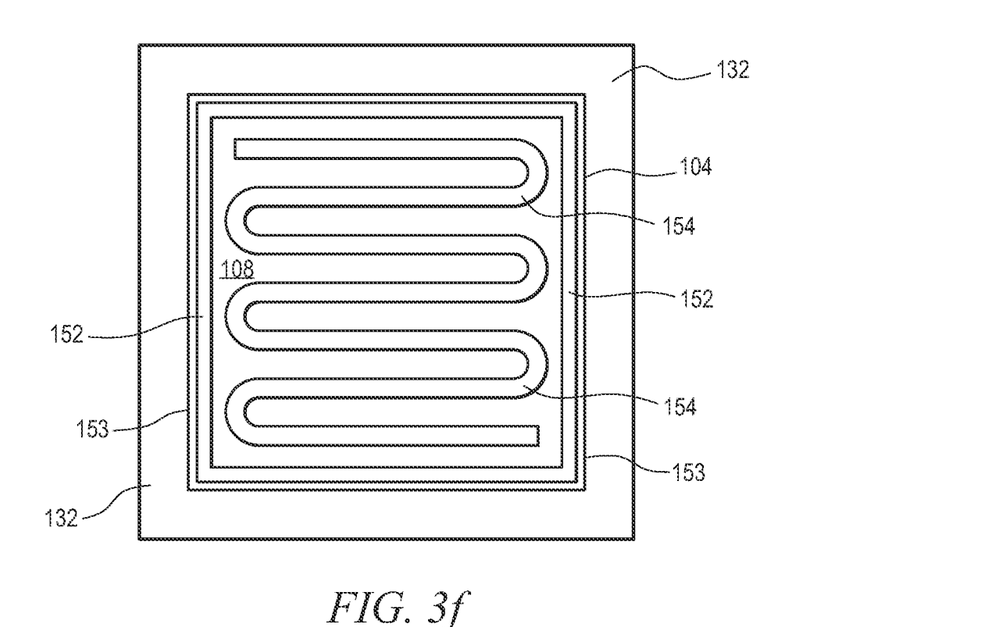

FIG. 3a shows semiconductor package 150 post-singulation. A first thermal interface material (TIM) 152 is deposited on back surface 108 of semiconductor die 104. TIM 152 extends in a linear pattern around a perimeter or along side surfaces 153 of semiconductor die 104, as shown in top view of FIG. 3b. TIM 152 is deposited as a soft, compliant material and cures to a hard material with high adhesion properties. In one embodiment, TIM 152 is an adhesive with filler containing alumina (Al2O3), Al, Ag, or aluminum zinc oxide and a thermal conductivity of 1.9-11 W/m.K. TIM 152 is cured for 30-120 minutes at 120-150° C. with a post-cure Young's modulus of 0.036-0.075 Gpa. A second TIM 154 is deposited over a central portion of back surface 108 of semiconductor die 104 and extends in a star pattern toward side surfaces 153 of the semiconductor die within TIM 152. TIM 154 can have a variety of patterns and geometric shapes. For example, TIM 154 can be a series of concentric circles, as shown in FIG. 3c. In FIG. 3d, TIM 154 is a grid of dots. In FIG. 3e, TIM 154 is a series of parallel strips. In FIG. 3f, TIM 154 is a serpentine pattern, the possibilities are unlimited. TIM 154 is deposited as a soft, compliant material and remains a soft, compliant material with high thermal transfer and mechanical stress relief properties. In one embodiment, TIM 154 is an adhesive with filler containing alumina, Al, or aluminum zinc oxide and a thermal conductivity of 3.2-5.7 W/m.K. TIM 154 is cured for 60-120 minutes at 125-150° C. with a post-cure Young's modulus of 0.00044-0.0014 Gpa. The combination of TIM 152 and 154 constitutes a hybrid TIM layer.

In an alternate embodiment, TIM 152 is the soft compliant material and TIM 154 is the hard material with the respective properties identified above, depending on the stress profile of semiconductor die 104. The soft compliant material is positioned over the high stress areas, whether on the interior or perimeter of semiconductor die 104.

Figure 3G:
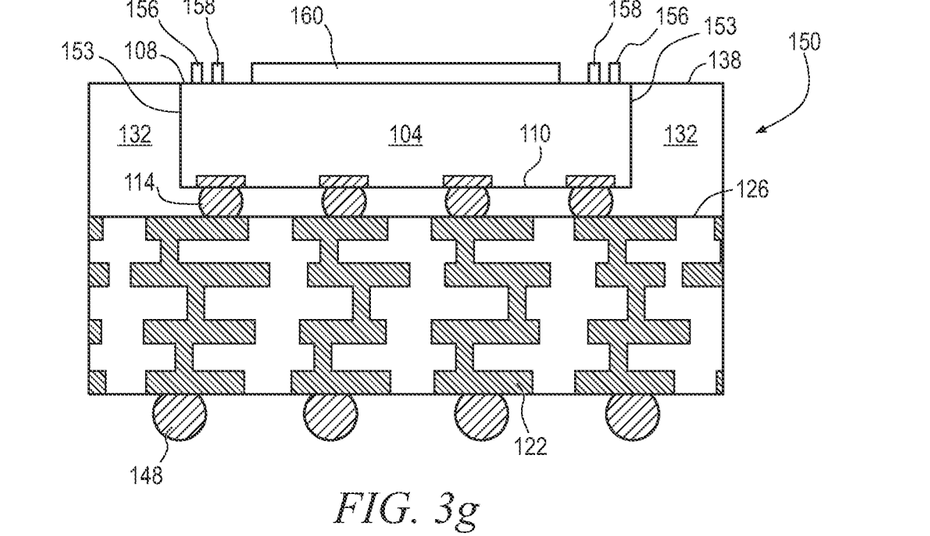
Figure 3H:
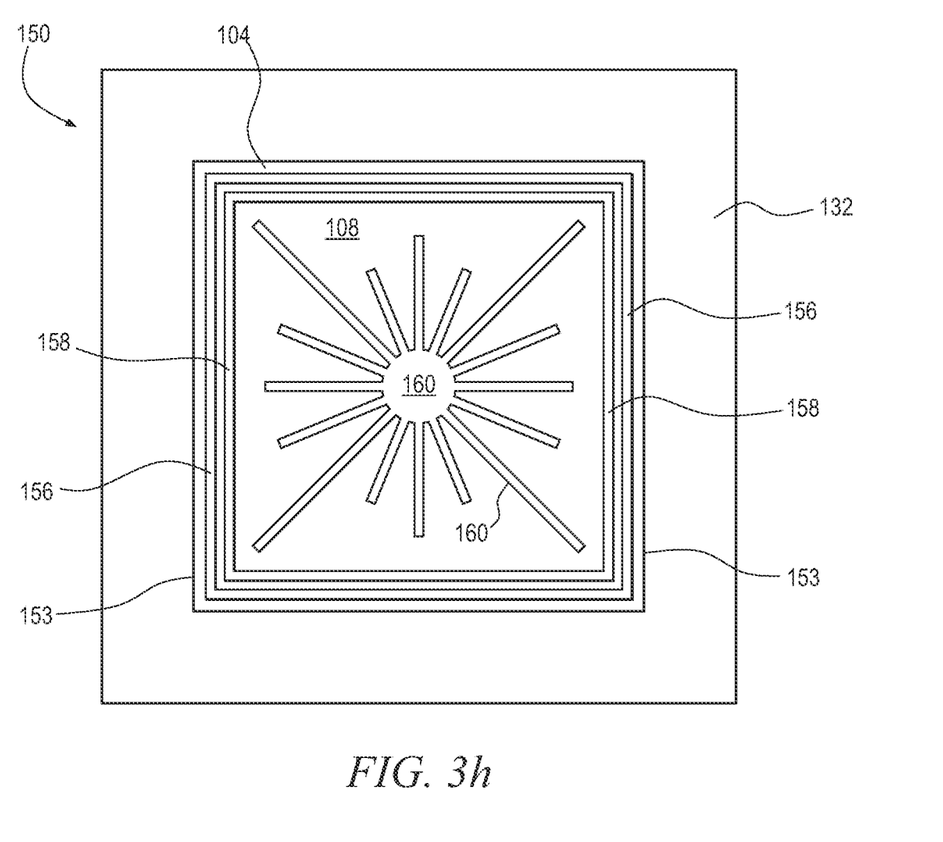
Figure 3I:
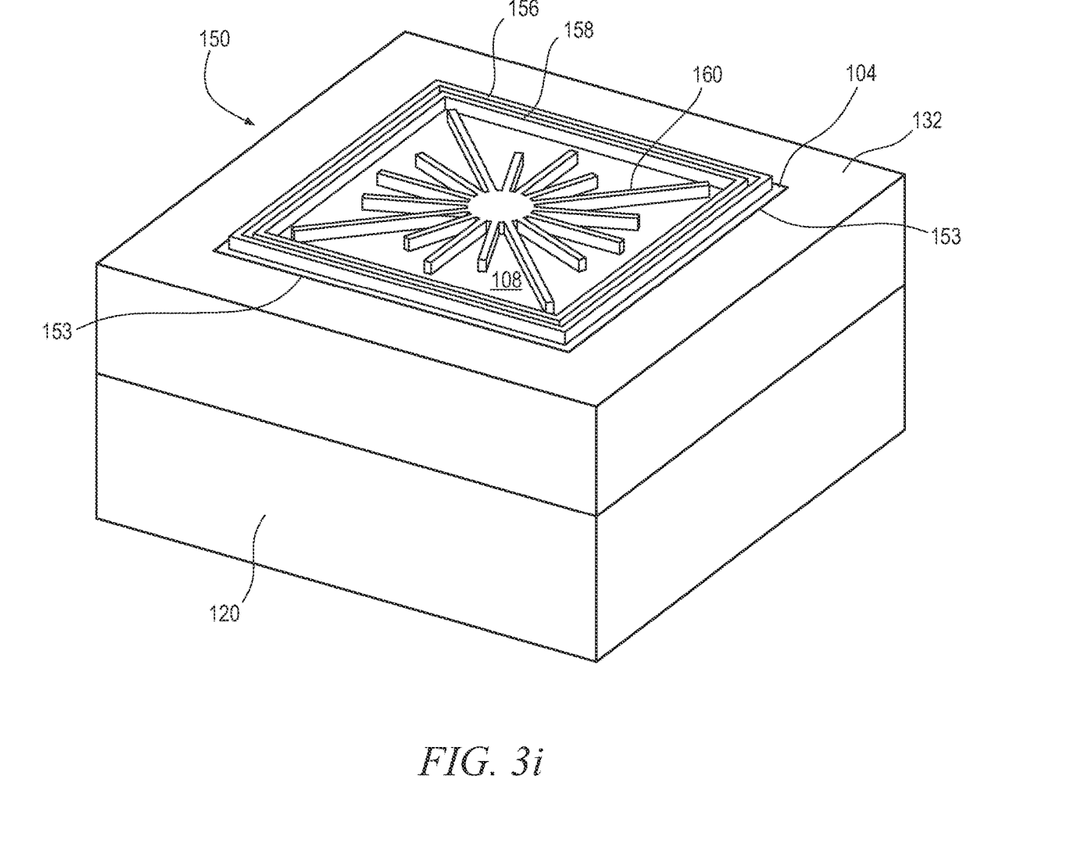

In another embodiment, FIG. 3g shows TIM 156 deposited on back surface 108 of semiconductor die 104. TIM 156 extends in a linear pattern around a perimeter or along side surfaces 153 of semiconductor die 104, as shown in top view of FIG. 3h. TIM 158 is deposited on back surface 108 of semiconductor die 104. TIM 158 extends in a linear pattern within or inside the linear pattern of TIM 156. TIM 156 and 158 are deposited as a soft, compliant material and cure to a hard material with high adhesion properties. In one embodiment, TIM 156 and 158 are an adhesive with filler containing alumina (Al2O3), Al, Ag, or aluminum zinc oxide and a thermal conductivity of 1.9-11 W/m.K. TIM 156 and 158 are cured for 30-120 minutes at 120-150° C. with a post-cure Young's modulus of 0.036-0.075 Gpa. TIM 160 is deposited over a central portion of back surface 108 of semiconductor die 104 and extends in a star pattern toward side surfaces 153 of the semiconductor die within TIM 156 and 158. TIM 160 can have a variety of patterns and geometric shapes, see FIGS. 3c-3f. For example, TIM 160 can be a series of concentric circles or other geometric shapes. TIM 160 can be a grid of dots. TIM 160 can be a serpentine strip or a series of parallel strips, the possibilities are unlimited. TIM 160 is deposited as a soft, compliant material and remains a soft, compliant material with high thermal transfer and mechanical stress relief properties. In one embodiment, TIM 160 is an adhesive with filler containing alumina, Al, or aluminum zinc oxide and a thermal conductivity of 3.2-5.7 W/m.K. TIM 160 is cured for 60-120 minutes at 125-150° C. with a post-cure Young's modulus of 0.00044-0.0014 Gpa. The combination of TIM 156-160 constitutes a hybrid TIM layer. FIG. 3i is a perspective view of semiconductor package 150 with TIM 156, TIM 158, and TIM 160, as described above.

In an alternate embodiment, TIM 155 and/or 158 are the soft compliant material and TIM 160 is the hard material with the respective properties identified above, depending on the stress profile of semiconductor die 104. The soft compliant material is positioned over the high stress areas, whether on the interior or perimeter of semiconductor die 104.

Figure 3J:
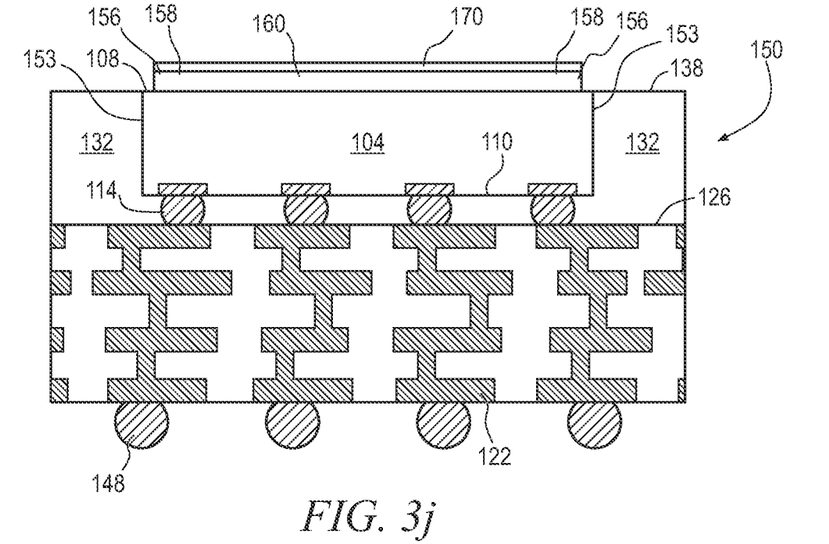
Figure 3K:
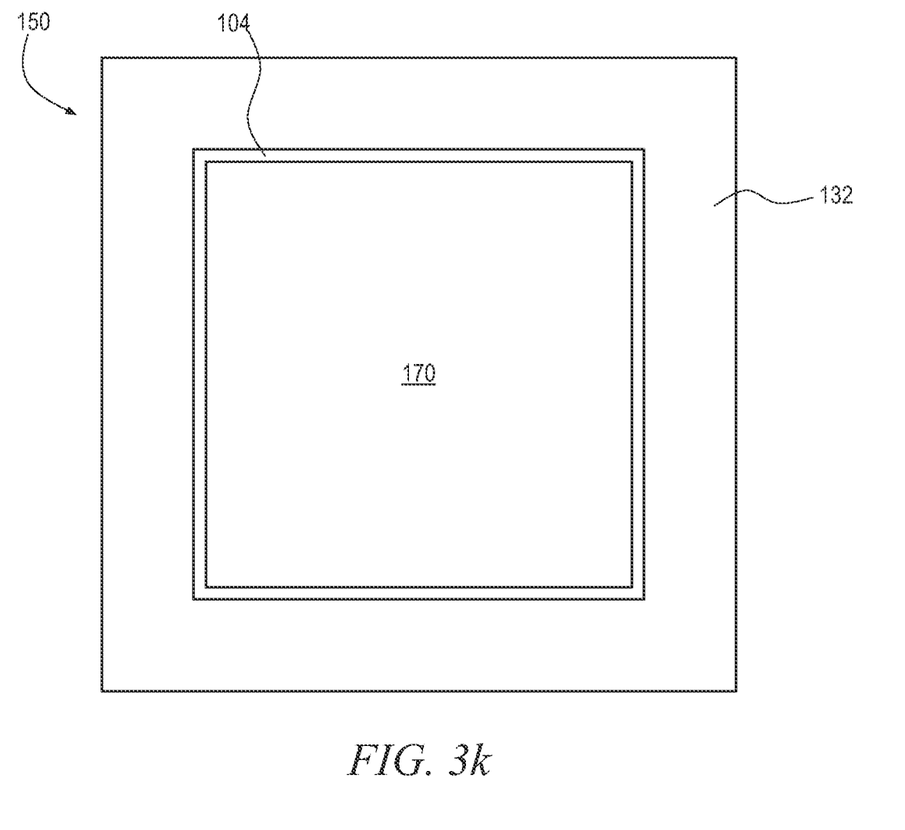

In FIG. 3j, a heat sink 170 is disposed over back surface 108 of semiconductor die 104 and TIM 152-154 or TIM 156-160. Heat sink 170 can be one or more layers of Al, Cu, Sn, Ni, Au, Ag, or other suitable conductive material. FIG. 3k illustrates a top view of heat sink 170.

Figure 4A:
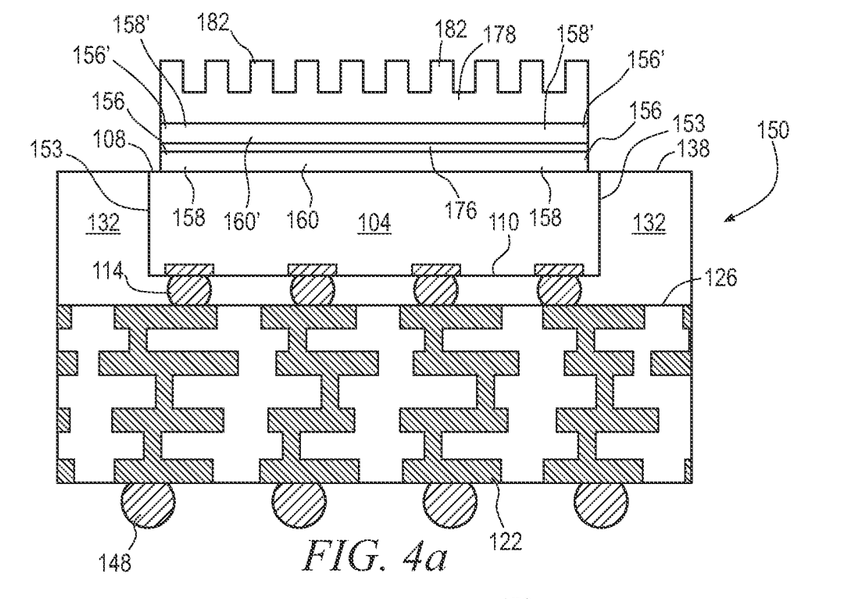
FIGS. 4a-4b illustrate an alternate embodiment of the semiconductor package with heat spreader and heat sink between multiple hybrid TIM layers.
Figure 4B:
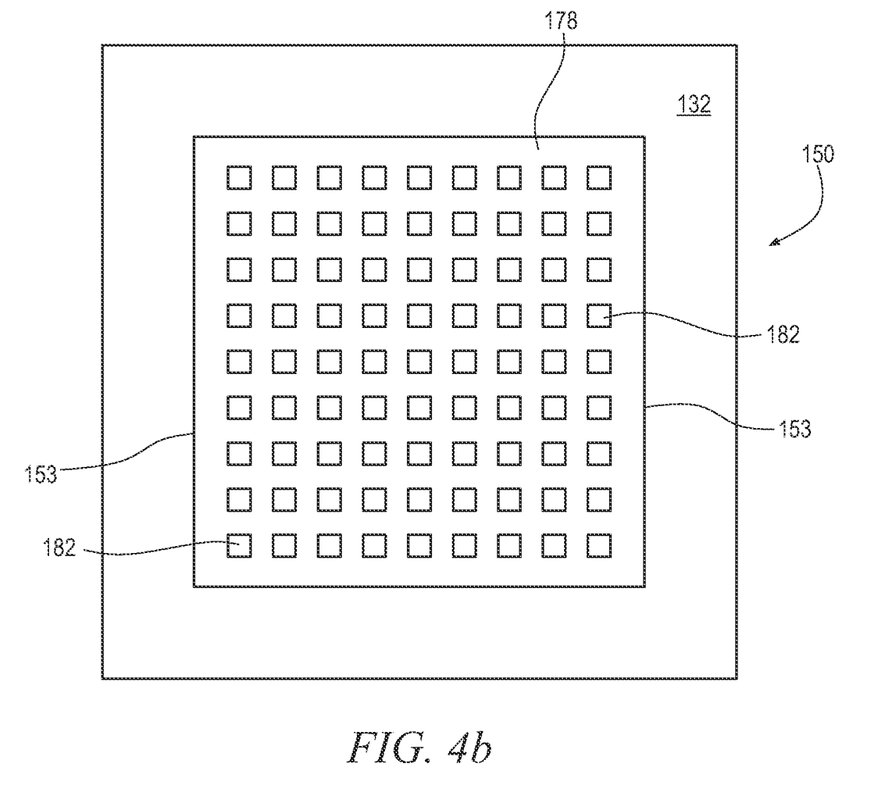

FIG. 4a illustrates an alternate embodiment with a first layer of TIM 156-160 disposed over back surface 108 of semiconductor die 104. Heat spreader 176 is disposed over TIM 156-160. A second layer of TIM 156'-160' is deposited over heat spreader 176, similar to FIGS. 3g-3h, and heat sink 178 with fins 182 is disposed over the second layer of TIM 156'-160'. FIG. 4b illustrates a top view of heat sink 178 and fins 182.

TIM 152 and TIM 156 and TIM 158 have high adhesion properties post-cure that provide heat transfer and high joint reliability between heat sink 170 or heat spreader 176 and back surface 108 of semiconductor die 104. TIM 156' and TIM 158' have high adhesion properties post-cure that provide heat transfer and high joint reliability between heat sink 178 and heat spreader 176. TIM 154 and TIM 160 have soft and compliant properties post-cure that provide for heat transfer and relieve mechanical stress between heat sink 170 or heat spreader 176 and back surface 108 of semiconductor die 104. Any mechanical stress between the different CTEs of heat sink 170 or heat spreader 176 and semiconductor die 104 is dissipated by TIM 154 or TIM 156-158. TIM 160' has soft and compliant properties post-cure that provide heat transfer and relieve mechanical stress between heat sink 178 or heat spreader 176.

Accordingly, semiconductor package 150 exhibits good heat transfer from a center portion of semiconductor die 104 through TIM 154 or TIM 160 to heat sink 170, or heat spreader 176 and heat sink 178. Semiconductor package 150 exhibits good joint reliability with TIM 152 or TIM 156-158. TIM 152 provides high adhesion post-cure for high reliable joint between heat sink 170 and back surface 108 of semiconductor die 104. TIM 154 provides a soft and compliant interface for heat transfer and dissipation from a center portion of semiconductor die 104, and further provides for mechanical stress relief from dissimilar CTEs of heat sink 170 and back surface 108 of semiconductor die 104. TIM 156 and 158 provides high adhesion post-cure for high reliable joint between heat sink 170 or heat spreader 176 and back surface 108 of semiconductor die 104. TIM 160 provides a soft and compliant interface for heat transfer and dissipation from a center portion of semiconductor die 104, and further provides for mechanical stress relief from dissimilar CTEs of heat sink 170 or heat spreader 176 and back surface 108 of semiconductor die 104. TIM 156' and 158' provide high adhesion post-cure for high reliable joint between heat sink 178 and heat spreader 176. TIM 160' provides a soft and compliant interface for heat transfer and dissipation from a center portion of semiconductor die 104, and further provides for mechanical stress relief from dissimilar CTEs of heat sink 178 and heat spreader 176.

In an alternate embodiment, TIM 156, 158, 156', and/or 158' are the soft compliant material and TIM 160 and/or 160' are the hard material with the respective properties identified above, depending on the stress profile of semiconductor die 104. The soft compliant material is positioned over the high stress areas, whether on the interior or perimeter of semiconductor die 104.

Figure 5:
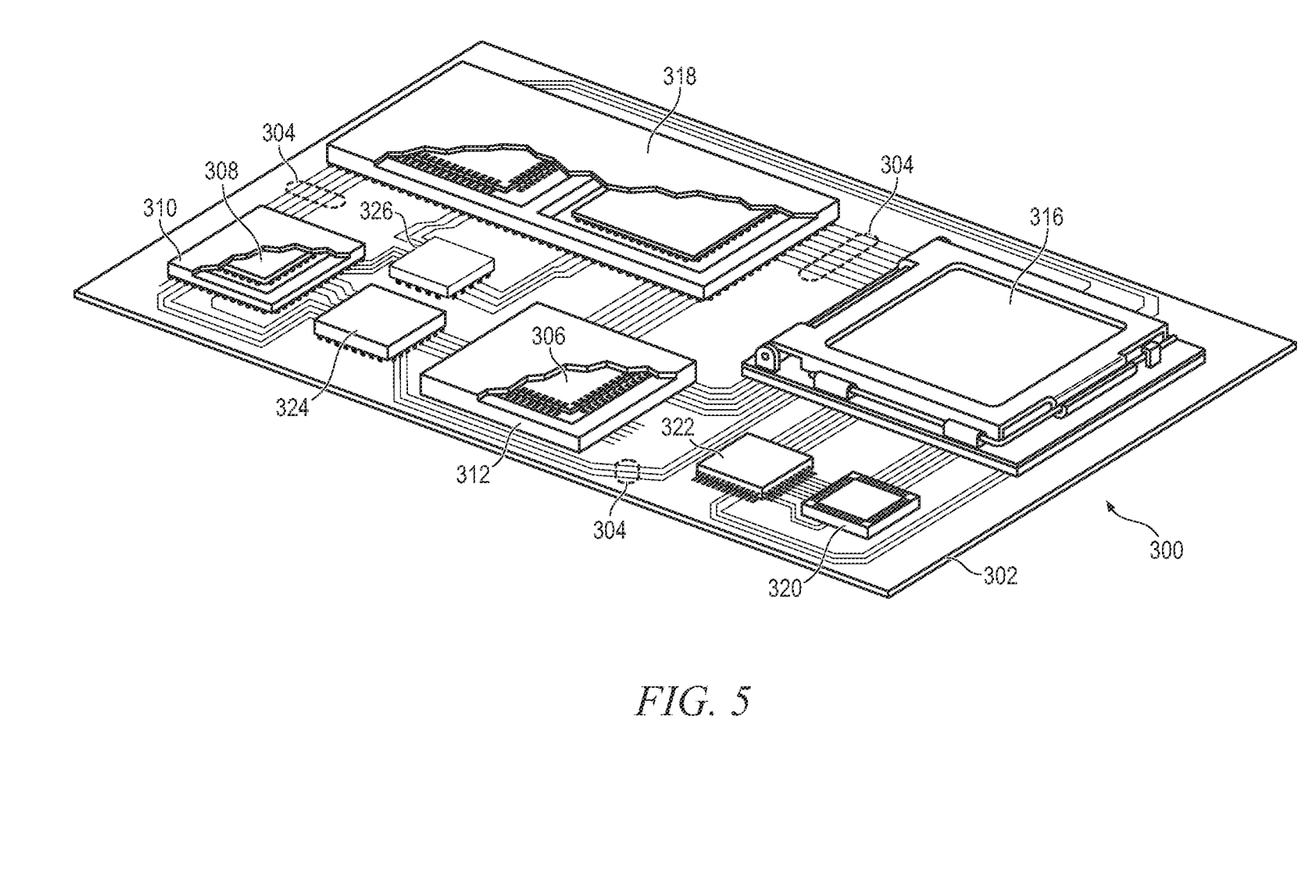
FIG. 5 illustrates a printed circuit board (PCB) with different types of packages mounted to a surface of the PCB.

FIG. 5 illustrates electronic device 300 having a chip carrier substrate or PCB 302 with a plurality of semiconductor packages mounted on a surface of PCB 302, including SIP modules 170, 210, and 236. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing an electrical component;
   disposing a first thermal interface material (TIM) including a first compliant property over a surface of the electrical component around a perimeter of the electrical component; and
   disposing a second TIM including a second compliant property greater than the first compliant property over the surface of the electrical component within the first TIM, wherein the second TIM is disposed relative to the first TIM to have a gap separating the first TIM and second TIM.

2. The method of claim 1, further including:
   providing an interconnect substrate; and
   disposing the electrical component over the interconnect substrate.

3. The method of claim 1, further including disposing a heat sink over the first TIM and second TIM.

4. A method of making a semiconductor device, comprising:
   providing an electrical component;
   disposing a first thermal interface material (TIM) including a first compliant property over a surface of the electrical component around a perimeter of the electrical component;
   disposing a second TIM including a second compliant property greater than the first compliant property over the surface of the electrical component within the first TIM; and
   disposing a third TIM over the surface of the electrical component along the first TIM.

5. The method of claim 1, wherein the second TIM has a shape selected from the group consisting of a star pattern, grid of dots, parallel strips, serpentine, and concentric geometric shapes.

6. The method of claim 1, wherein the first TIM provides adhesion for joint reliability and the second TIM provides stress relief.

7. A method of making a semiconductor device, comprising:
   providing an electrical component;
   disposing a first thermal interface material (TIM) having a first compliant property over a surface of the electrical component; and
   disposing a second TIM having a second compliant property over the surface of the electrical component within the first TIM, wherein the second compliant property is greater than the first compliant property and the second TIM is disposed relative to the first TIM to have a space separating the first TIM and second TIM.

8. The method of claim 7, further including:
   providing an interconnect substrate; and
   disposing the electrical component over the interconnect substrate.

9. The method of claim 7, further including disposing a heat sink over the first TIM and second TIM.

10. The method of claim 7, further including disposing a third TIM over the surface of the electrical component along the first TIM.

11. The method of claim 7, wherein the second TIM has a shape selected from the group consisting of a star pattern, grid of dots, parallel strips, serpentine, and concentric geometric shapes.

12. The method of claim 7, wherein the first TIM provides adhesion for joint reliability and the second TIM provides stress relief.

13. The method of claim 7, further including:
   disposing a heat spreader over the first TIM and second TIM;
   disposing a third TIM having the first compliant property over a surface of the heat spreader;
   disposing a fourth TIM having the second compliant property over the surface of the heat spreader within the first TIM; and
   disposing a heat sink over the third TIM and fourth TIM.

14. A semiconductor device, comprising:
   an electrical component;
   a first thermal interface material (TIM) including a first compliant property disposed over a surface of the electrical component; and
   a second TIM including a second compliant property greater than the first compliant property disposed over the surface of the electrical component within the first TIM, wherein the second TIM is disposed relative to the first TIM to have a gap separating the first TIM and second TIM.

15. The semiconductor device of claim 14, further including an interconnect substrate, where the electrical component is disposed over the interconnect substrate.

16. The semiconductor device of claim 14, further including a heat sink disposed over the first TIM and second TIM.

17. The semiconductor device of claim 14, further including a third TIM disposed over the surface of the electrical component along the first TIM.

18. The semiconductor device of claim 14, wherein the second TIM has a shape selected from the group consisting of a star pattern, grid of dots, parallel strips, serpentine, and concentric geometric shapes.

19. The semiconductor device of claim 14, wherein the first TIM provides adhesion for joint reliability and the second TIM provides stress relief.

20. A semiconductor device, comprising:
    an electrical component;
    a first thermal interface material (TIM) having a first compliant property disposed over a surface of the electrical component; and
    a second TIM having a second compliant property disposed over the surface of the electrical component within the first TIM, wherein the second compliant property is greater than the first compliant property and the second TIM is disposed relative to the first TIM to have a space separating the first TIM and second TIM.

21. The semiconductor device of claim 20, further including a heat sink disposed over the first TIM and second TIM.

22. The semiconductor device of claim 20, further including a third TIM disposed over the surface of the electrical component along the first TIM.

23. The semiconductor device of claim 20, wherein the second TIM has a shape selected from the group consisting of a star pattern, grid of dots, parallel strips, serpentine, and concentric geometric shapes.

24. The semiconductor device of claim 20, wherein the first TIM provides adhesion for joint reliability and the second TIM provides stress relief.

25. The semiconductor device of claim 20, further including:
    a heat spreader over the first TIM and second TIM;
    a third TIM having the first compliant property disposed over a surface of the heat spreader;
    a fourth TIM having the second compliant property disposed over the surface of the heat spreader within the first TIM; and
    a heat sink disposed over the third TIM and fourth TIM.

* * * * *